(12) United States Patent
Gamini et al.

(10) Patent No.: US 8,300,425 B2
(45) Date of Patent: Oct. 30, 2012

(54) ELECTRONIC ASSEMBLIES WITHOUT SOLDER HAVING OVERLAPPING COMPONENTS

(75) Inventors: Nader Gamini, Cupertino, CA (US); Joseph C. Fjelstad, Maple Valley, WA (US)

(73) Assignee: Occam Portfolio LLC, Cupertino, CA (US)

( * ) Notice: Subject to any disclaimer, the term of this patent is extended or adjusted under 35 U.S.C. 154(b) by 781 days.

(21) Appl. No.: 12/184,086

(22) Filed: Jul. 31, 2008

(65) Prior Publication Data

US 2009/0034219 A1   Feb. 5, 2009

Related U.S. Application Data

(63) Continuation-in-part of application No. 12/119,287, filed on May 12, 2008, now abandoned, and a continuation-in-part of application No. 12/163,870, filed on Jun. 27, 2008, now Pat. No. 7,926,173, and a continuation-in-part of application No. PCT/US2008/065131, filed on May 29, 2008, and a continuation-in-part of application No. 12/170,426, filed on Jul. 9, 2008, and a continuation-in-part of application No. 12/182,043, filed on Jul. 29, 2008, now abandoned.

(60) Provisional application No. 60/962,627, filed on Jul. 31, 2007, provisional application No. 60/963,822, filed on Aug. 6, 2007, provisional application No. 60/966,643, filed on Aug. 28, 2007, provisional application No. 61/038,564, filed on Mar. 21, 2008, provisional application No. 61/039,059, filed on Mar. 24, 2008, provisional application No. 61/075,238, filed on Jun. 24, 2008.

(51) Int. Cl.
*H05K 7/02* (2006.01)
(52) U.S. Cl. ......................... 361/807; 174/255
(58) Field of Classification Search ................. 361/807, 361/784; 257/686, 706, 777; 438/127; 174/260–262, 255
See application file for complete search history.

(56) References Cited

U.S. PATENT DOCUMENTS

| | | | |
|---|---|---|---|
| 4,635,356 A | 1/1987 | Ohuchi | |
| 5,734,555 A | 3/1998 | McMahon | |
| 6,972,372 B1 | 12/2005 | Tsai et al. | |
| 7,247,519 B2 | 7/2007 | Karnezos et al. | |
| 7,550,857 B1 * | 6/2009 | Longo et al. | 257/777 |
| 2002/0137263 A1 * | 9/2002 | Towle et al. | 438/127 |
| 2003/0057544 A1 * | 3/2003 | Nathan et al. | 257/700 |
| 2003/0087538 A1 * | 5/2003 | Ueno | 439/68 |
| 2006/0097380 A1 * | 5/2006 | Sato | 257/706 |
| 2006/0151860 A1 * | 7/2006 | Islam et al. | 257/676 |
| 2006/0278967 A1 * | 12/2006 | Tuominen et al. | 257/686 |
| 2007/0035015 A1 | 2/2007 | Hsu | |
| 2007/0102803 A1 | 5/2007 | Gann | |

OTHER PUBLICATIONS

EP Application No. 08756454.8, European Search Report dated Mar. 21, 2012.
International Application No. PCT/US08/86479, International Preliminary Report on Patentability mailed on Mar. 8, 2012.

* cited by examiner

*Primary Examiner* — Yuriy Semenenko
(74) *Attorney, Agent, or Firm* — Edward P. Heller, III

(57) ABSTRACT

An apparatus is disclosed that improves density of electrical components in a circuit assembly. Electrical components 202, 204 are stacked so that they overlap each other and are encapsulated in an electronic insulating material 104. The resulting subassembly may be integrated onto a printed circuit board or into a reverse-interconnection process assembly.

1 Claim, 5 Drawing Sheets

ELECTRONIC ASSEMBLIES WITHOUT SOLDER HAVING OVERLAPPING COMPONENTS

CROSS-REFERENCE TO RELATED APPLICATIONS

This application claims the benefit of U.S. Provisional Application No. 60/962,627, filed on Jul. 31, 2007, hereby incorporated by reference in its entirety; U.S. Provisional Application No. 60/963,822, filed on Aug. 6, 2007, hereby incorporated by reference in its entirety; U.S. Provisional Application No. 60/966,643, filed on Aug. 28, 2007, hereby incorporated by reference in its entirety; U.S. Provisional Application No. 61/038,564, filed on Mar. 21, 2008, hereby incorporated by reference in its entirety; U.S. Provisional Application No. 61/039,059 filed on Mar. 24, 2008, hereby incorporated by reference in its entirety; and U.S. Provisional Application No. 61/075,238 filed on Jun. 24, 2008, hereby incorporated by reference in its entirety.

This application is a continuation-in-part application of pending U.S. patent application Ser. No. 12/119,287, ELECTRONIC ASSEMBLIES WITHOUT SOLDER AND METHODS FOR THEIR MANUFACTURE; U.S. patent application Ser. No. 12/163,870, ELECTRONIC ASSEMBLIES WITHOUT SOLDER AND METHODS FOR THEIR MANUFACTURE; PCT Patent Application No. PCT/US2008/065131, ELECTRONIC ASSEMBLIES WITHOUT SOLDER AND METHODS FOR THEIR MANUFACTURE; U.S. patent application Ser. No. 12/170,426, ELECTRONIC ASSEMBLIES WITHOUT SOLDER AND METHODS FOR THEIR MANUFACTURE; and U.S. patent application Ser. No. 12/182,043, ASSEMBLY OF ENCAPSULATED ELECTRONIC COMPONENTS TO A PRINTED CIRCUIT BOARD; hereby incorporated by reference in their entirety.

COPYRIGHT NOTICE AND PERMISSION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the field of electronic assembly and more specifically to the manufacture and assembly of electronic products having overlapping components.

BACKGROUND OF THE INVENTION

Historically, most electronic products have been assembled using a solder material and a soldering process. This has always had disadvantages, and a number of new trends are revealing or exacerbating other disadvantages.

One set of disadvantages relates to solder materials themselves. Since the earliest days of the electronics industry tin/lead type solders (e.g., Sn63/Pb37) have been widely used. Unfortunately, both tin and especially lead have serious chemical disadvantages. For these two metals, mining the ores, refining it, working with the refined metals during manufacturing, being exposed to the substances in manufactured products, and disposing of the products at the ends of their life cycles are all potentially damaging to human health and to the environment.

Recently human health and environmental concerns about tin/lead type solders have resulted in the Directive on the Restriction of the Use of Certain Hazardous Substances in Electrical and Electronic Equipment (commonly referred to as the Restriction of Hazardous Substances Directive or RoHS) in the European Union. This directive restricts the use of six hazardous materials, including lead, in the manufacture of various types of electronic and electrical equipment. This directive is also closely linked with the Waste Electrical and Electronic Equipment Directive (WEEE) 2002/96/EC, which sets collection, recycling, and recovery targets for electrical goods. Together these directives are part of a growing worldwide legislative initiative to solve the problem of electronic device waste.

To some extent the electronics industry has always been searching for a practical substitute for tin/lead type solders, and legislative initiatives like those just noted are now motivating a number of changes. Today a common substitute for tin/lead type solders are SAC type solder varieties, which are alloys containing tin (Sn), silver (Ag), and copper (Cu). But this is merely a compromise. Mining, refining, working during manufacturing, exposure from manufactured products, and disposal are still all issues for tin, silver, and copper. It therefore suffices here to say that the undue use of some materials, like solder, is generally undesirable in electronic assemblies. Another set of disadvantages in the solder-based assembly of electronic products is the heat-based processes that are inherently required. The use of heat on and around many electronic components has always been undesirable. As a general principle, the heating of electronic components increases their failure rate and beyond a certain point outright damages such components. Tin/lead solders melt at relatively low temperatures, and their use has generally been tolerable for many components. This is not as frequently the same for SAC type solders, however, which melt at much higher temperatures. When SAC type solders are used, the likelihood of component damage is much higher, resulting in assemblies that fail during post-manufacturing testing as well as in-the-field failures. Additionally, generating and managing the heat during manufacturing have energy, safety, and financial costs. In addition, the undue use of lead-based manufacturing processes, like soldering, is also generally undesirable in electronic assemblies.

Increasingly yet another set of disadvantages in the solder-based assembly of electronic products is related to the "adding" of materials. When a material, like solder, is added between two components to hold them together, the additional material inherently has to occupy some space. The use of liquid-state materials, like solder in its liquid stage, in manufacturing often requires additional space around leads, terminals, and pads because both product and process designs need to account for the ability of liquid to flow easily and thus to potentially short to other leads, terminals, pads, etc. Liquid surface tension effects are also usually a major consideration in such designs, as liquid solders have high surface tensions. These all thus are factors as designers increasingly strive to miniaturize electronic assemblies. So the undue use of additional material, including solder, in manufactured assemblies and manufacturing processes is generally undesirable.

The density of components on circuit boards may be increased by building up in a vertical direction. Components may be stacked one on top of another. This type of assembly reduces size and cost. It is also amenable to manufacture by means of reverse-interconnection process (RIP) as disclosed in related U.S. patent application Ser. No. 12/119,287, ELECTRONIC ASSEMBLIES WITHOUT SOLDER AND METHODS FOR THEIR MANUFACTURE; U.S. patent application Ser. No. 12/163,870, ELECTRONIC ASSEMBLIES WITHOUT SOLDER AND METHODS FOR THEIR MANUFACTURE; PCT Patent Application No. PCT/US2008/065131, ELECTRONIC ASSEMBLIES WITHOUT SOLDER AND METHODS FOR THEIR MANUFACTURE; U.S. patent application Ser. No. 12/170,426, ELECTRONIC ASSEMBLIES WITHOUT SOLDER AND METHODS FOR THEIR MANUFACTURE; and U.S. patent application Ser. No. 12/182,043, ASSEMBLY OF ENCAPSULATED ELECTRONIC COMPONENTS TO A PRINTED CIRCUIT BOARD; hereby incorporated by reference in their entirety and assigned to the assignee of the present invention.

BRIEF SUMMARY OF THE INVENTION

It is an object of the present invention to provide improved assemblies of electronic components on circuit boards and in RIP assemblies.

It is a further object of the present invention to provide a solder or solderless apparatus joining electrical components, so that numerous electronic components may be electrically interconnected.

It is a further object of the present invention to provide a solder or solderless apparatus joining electrical components, so that electronic components are stacked upon each other and are electrically interconnected and integrated.

To improve the density of electrical components in a circuit assembly, components can be overlapped. In addition, the components can be encapsulated in an electronic insulating material. This assembly offers significant design benefits in solderless assembly including an increase in routing channels, a reduction in layer count, and an elimination of solder shorts and opens however, as previously stated they can be used as components either integrated or simply bonded to one another to create a stacked assembly without encapsulation, again however, lead frame components would potentially be subject to bending out of alignment.

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE SEVERAL VIEWS OF THE DRAWING(S)

The purposes and advantages of the present invention will be apparent from the following detailed description in conjunction with the appended figures of drawings in which.

In the various figures of the drawings, like references are used to denote like or similar elements or steps.

DETAILED DESCRIPTION OF THE INVENTION

The foregoing description details specific embodiments of the invention and are included for illustrative purposes. However, it will be apparent to one skilled in the art that many combinations and permutations of the following embodiments are possible while remaining within the scope and spirit of the invention.

Figure 1:
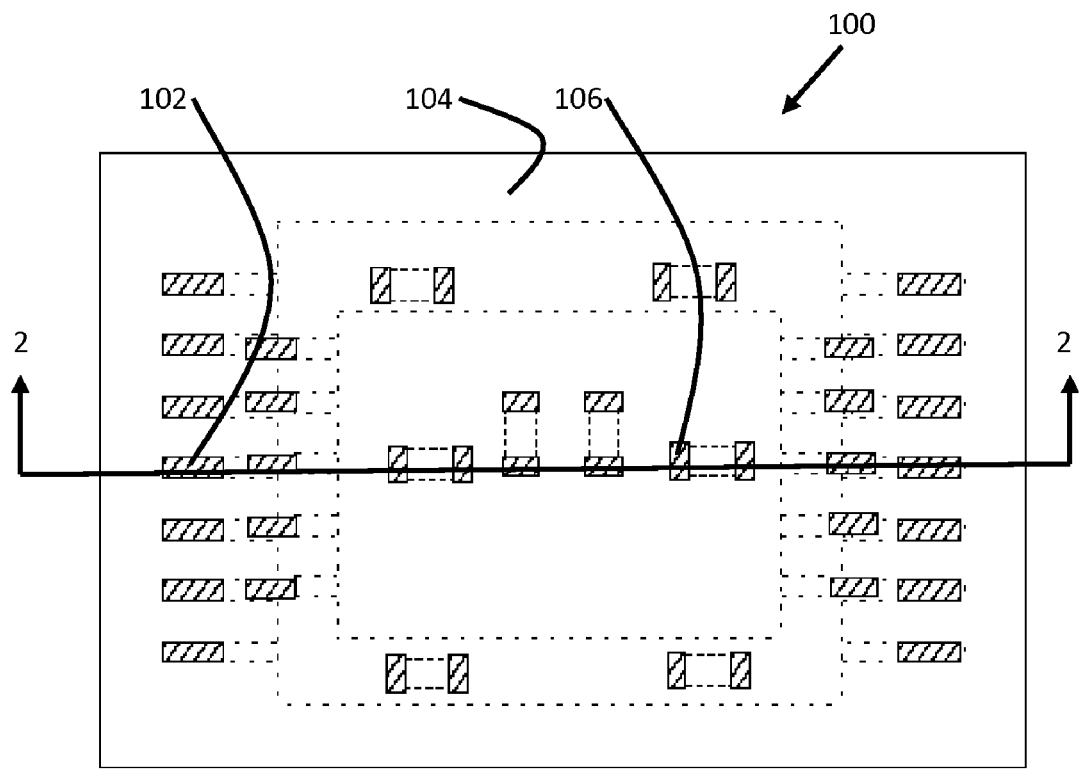
FIG. 1 shows a circuit subassembly viewed from a lead termination side.

FIG. 1 shows a subassembly 100 viewed from the lead termination (also referred to "pad" or "land" in the art) side of components encapsulated in electrical/electronic insulating material 104. Exposed are terminations such as gull wing component lead termination 102 and discrete or analog component lead termination 106.

Figure 2:
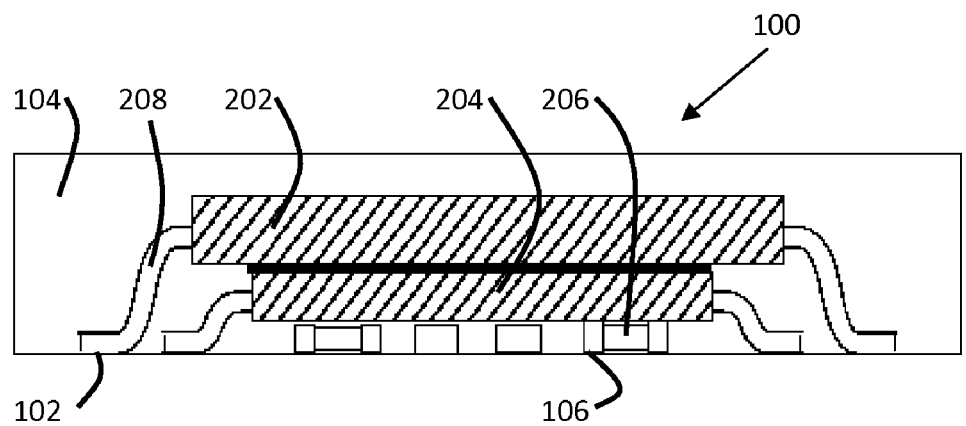
FIG. 2 is a cross-section of the apparatus shown in FIG. 1 taken along 1-1.

FIG. 2 is a section taken along 2-2 of FIG. 1 of subassembly 100. Shown previously in FIG. 1, the relative positions of electronic insulating material 104, exposed terminations, such as gull wing component lead termination 102 and discrete or analog component lead termination 106, are shown in FIG. 2. Upper gull wing component package 202, having lead 208, is mounted on middle component package 204. Lead 208 extends beyond package 204 and reaches a surface of electronic insulating material 104. Middle component package 204 is mounted on discrete or analog component 206 whose lead termination surface 106 reaches the surface of electronic insulating material 104. Termination surface 102 and termination surface 106, as well as other termination surfaces, are exposed and available for electrical connection to other terminations, traces, and/or a PCB.

Figure 3:
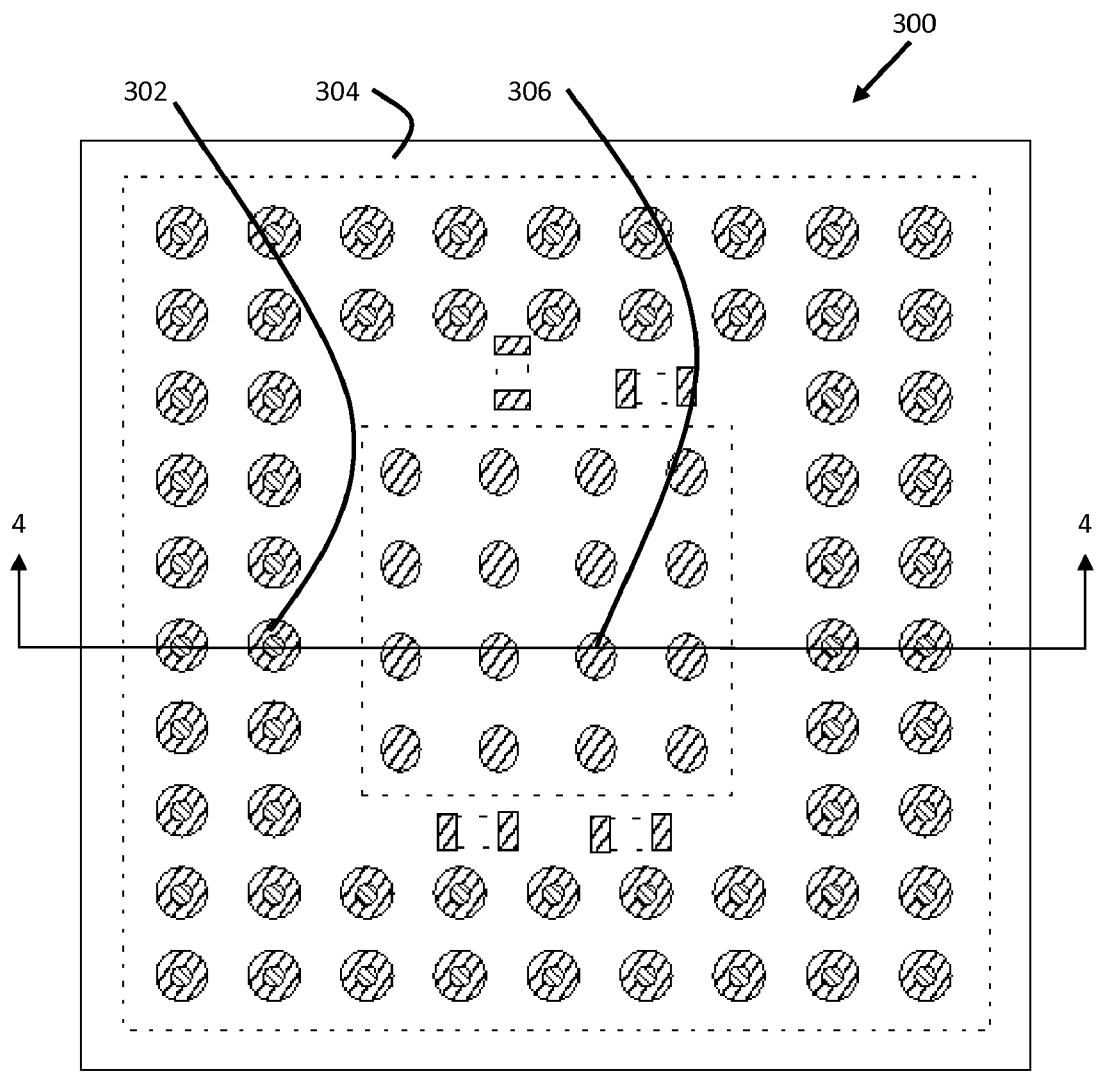
FIG. 3 shows a circuit subassembly viewed from a lead termination side.

FIG. 3 shows a subassembly 300 viewed from the lead termination side of components encapsulated in electronic insulating material 304. Exposed are terminations such as blind via plated interconnection termination surface 302 and land grid array (LGA) integrated circuit (IC) package termination surface 306.

Figure 4:
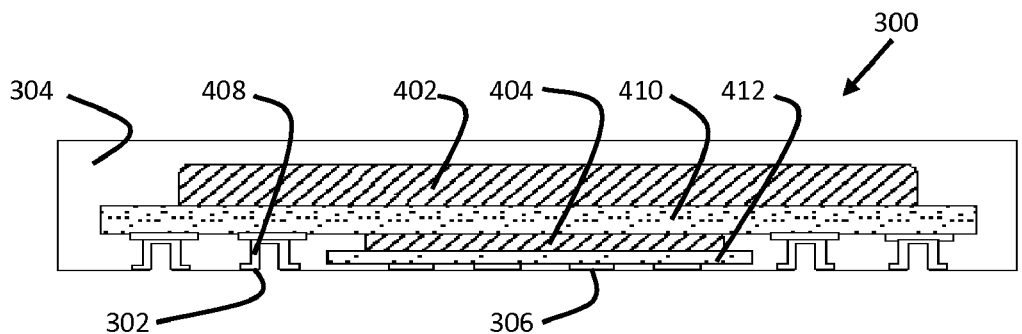
FIG. 4 is a cross-section of the apparatus shown in FIG. 3 taken along 3-3.

FIG. 4 is a section taken along 4-4 of FIG. 3 of subassembly 300. Shown previously in FIG. 3, the relative positions of electronic insulating material 304, exposed terminations, such as component lead termination 302 and component lead termination 306, are shown in FIG. 4. Upper component package 402, having area array IC package wiring substrate 410 and blind via plated interconnection lead 408, is mounted on lower component package 404. In turn, component package 404 has area array IC package wiring substrate 412. Lead 408 extends beyond substrate 410 and reaches a surface of electronic insulating material 304. A via extends from the surface of material 304 into lead 408. Component package 404, through substrate 412, has termination surface 306 reaching the surface of electrical/electronic insulating material 304. Lead 408 and termination surface 306, as well as other termination surfaces, are exposed and available for electrical connection to other terminations, traces, and/or PCB's.

Figure 5:
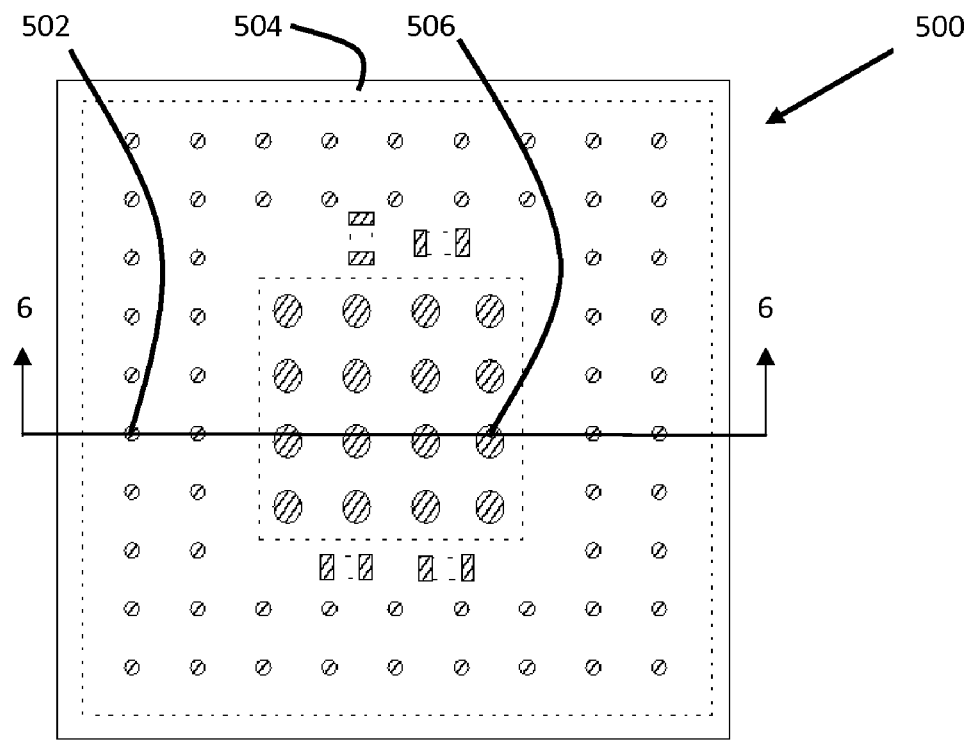
FIG. 5 shows a circuit subassembly viewed from a lead termination side.

FIG. 5 shows a subassembly 500 viewed from the lead termination side of components encapsulated in electronic insulating material 504. Exposed are terminations such as distal end of pin grid array termination 502 and LGA IC package termination surface 506.

Figure 6:
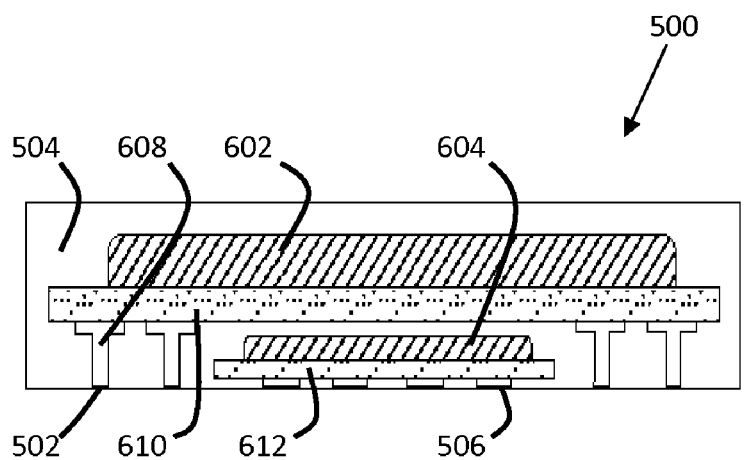
FIG. 6 is a cross-section of the apparatus shown in FIG. 5 taken along 5-5.

FIG. 6 is a section taken along 6-6 of FIG. 5 of subassembly 500. Shown previously in FIG. 5, the relative positions of electronic insulating material 504, exposed terminations, such as component lead termination 502 and component lead termination 506, are shown in FIG. 6. Upper component package 602, having area array IC package wiring substrate 610 and pin grid array lead 608, is mounted on lower component package 604. In turn, component package 604 has area array IC package wiring substrate 612. Lead 608 extends beyond substrate 610 and reaches a surface of electronic insulating material 504. Component package 604, through substrate 612, has termination surface 506 reaching the surface of electronic insulating material 504. Lead 608 and termination surface 506, as well as other termination surfaces, are exposed and available for electrical connection to other terminations, traces, and/or PCB's.

Figure 7:
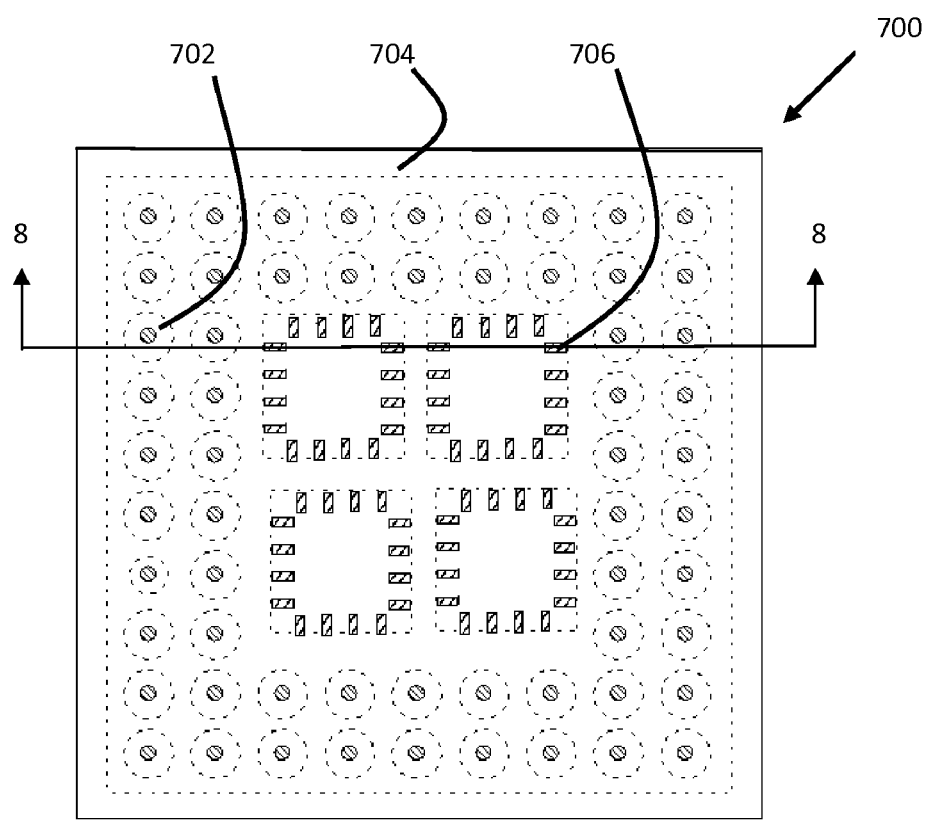
FIG. 7 shows a circuit subassembly viewed from a lead termination side.

FIG. 7 shows a subassembly 700 viewed from the lead termination side of components encapsulated in electronic insulating material 704. Exposed are terminations such as distal end of ball grid array (BGA) termination 702 and OFN IC package termination surface 706.

Figure 8:
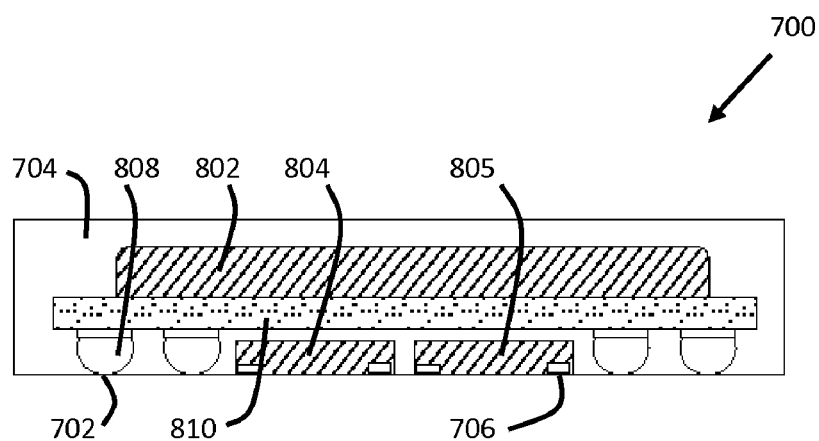
FIG. 8 is a cross-section of the apparatus shown in FIG. 7 taken along 7-7.

FIG. 8 is a section taken along 8-8 of FIG. 7 of circuit assembly 700. Shown previously in FIG. 7, the relative positions of electronic insulating material 704, exposed terminations, such as distal end of ball grid array (BGA) termination 702 and OFN IC package termination surface 706, are shown in FIG. 8. Upper component package 802, having area array IC package wiring substrate 810 and ball termination 808, is mounted on a first lower component package 804 and a second lower component package 805. Ball termination 808 reaches a surface of electronic insulating material 704. Second component package 805 has termination surface 706 reaching the surface of electrical/electronic insulating material 704. Ball termination 702 and termination surface 706, as well as other termination surfaces, are exposed and available for electrical connection to other terminations, traces, and/or PCB's.

Figure 9:
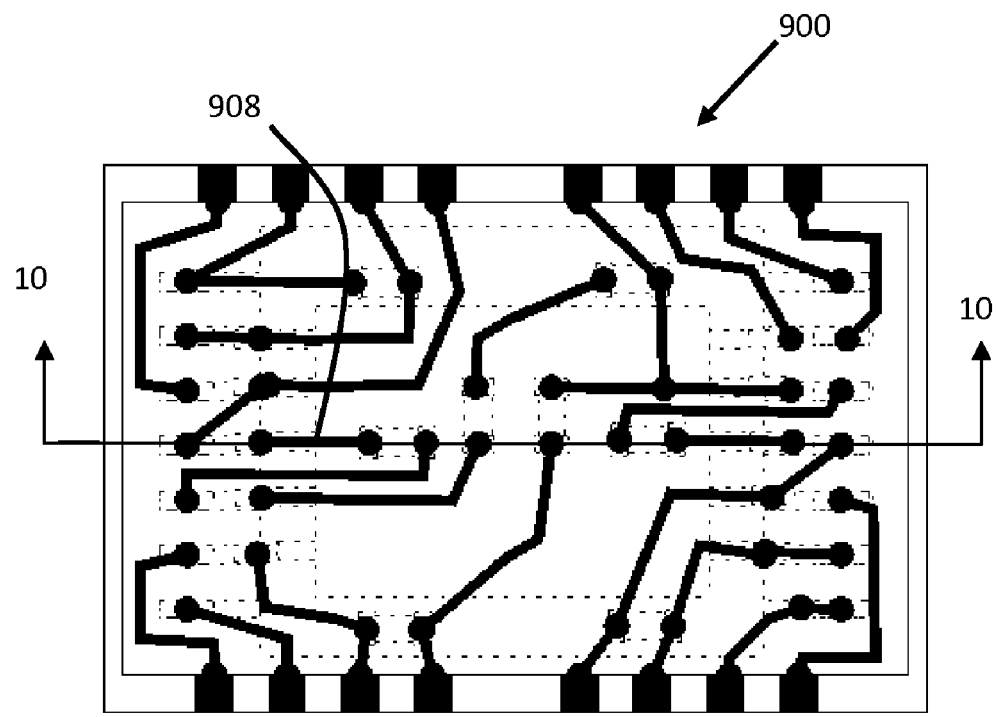
FIG. 9 shows a circuit subassembly viewed from a circuit trace side.

FIG. 9 shows a circuit subassembly 900 viewed from the circuit trace side. Exposed are traces such as trace 908.

Figure 10:
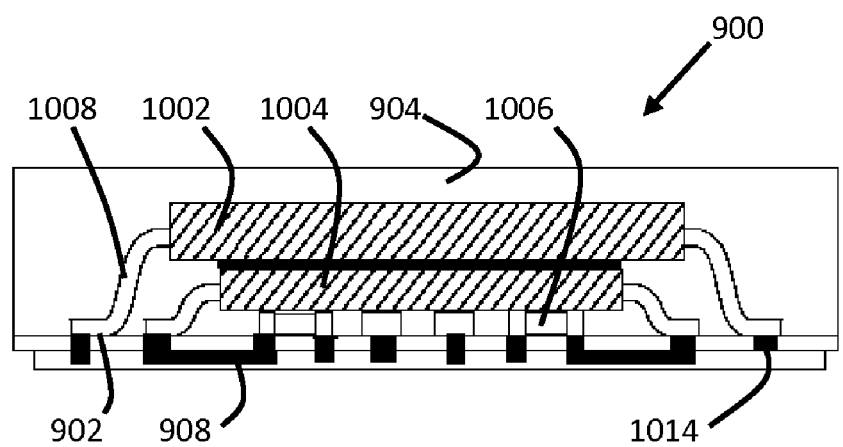
FIG. 10 is a cross-section of the apparatus shown in FIG. 9 taken along 9-9.

FIG. 10 is a section taken along 10-10 of FIG. 9 of circuit subassembly 900. Previously shown in FIG. 9, the relative position of trace 908 is shown in FIG. 10. Upper gull wing component package 1002, having lead 1008, is mounted on middle component package 1004. Lead 1008 extends beyond package 1004 and reaches a surface of electrical/electronic insulating material 904. Middle component package 1004 is mounted on discrete or analog component 1006 whose lead termination surfaces reach the surface of electronic insulating material 904. Termination surface 902, as well as other termination surfaces, are exposed and available for electrical connection to other terminations, traces, and/or a PCB. Vias filled with electrically conductive material, such as filled via 1014, connect termination surfaces to traces. In turn, traces such as trace 908, connect filled vias surfaces with one another (shown also in FIG. 9).

The foregoing description details specific embodiments of the invention and are included for illustrative purposes. However, it will be apparent to one skilled in the art that many combinations and permutations of the described embodiments are possible while remaining within the scope and spirit of the invention. For example, numerous similar or different types of electrical components may be mounted and overlap each other in multiple layers. Examples of types of electrical components include, but are not limited to, discrete or analog components, gull wing components, IC, LGA, BGA, CGA, QFN, QFP, TSOP, OFN, and PGA components, and other lead frame package and area array components. Preferably such components are fully tested and burned in before being committed to assembly.

As indicated above, this application is a continuation-in-part of applications U.S. patent application Ser. Nos. 12/119,287, 12/163,870, 12/170,426, 12/182,043, and PCT Patent Application No. PCT/US2008/065131, hereby incorporated by reference in their entirety. The subassemblies shown in FIGS. 1 to 10 can be incorporated into the reverse-interconnection process (RIP) assemblies disclosed and described in the above referenced applications. That is, the subassemblies can be mounted on a substrate with vias extending through the substrate to lead terminations (Ser. No. 12/119,287) and/or traces. The substrate may be flexible (Ser. No. 12/163,870). The subassemblies may be mounted back to back (PCT/US2008/065131). The subassemblies may be mounted on a foil base (Ser. No. 12/170,426). And the subassemblies may be joined and interconnected to a central bonding material which is connected to a PCB (Ser. No. 12/182,043).

While various embodiments have been described above, it should be understood that they have been presented by way of example only, and that the breadth and scope of the invention should not be limited by any of the above described exemplary embodiments, but should instead be defined only in accordance with the following claims and their equivalents.

We claim:

1. A circuit subassembly comprising:
   two or more stacked electrical components, the electrical components encapsulated in an electronic insulating material to form an encapsulated package having an exterior surface, each electrical component having at least one lead located entirely within the electronic insulating material, the lead electrically connecting the electrical component to said surface;
   the encapsulated package mounted on an area array IC package wiring substrate;
   the area array IC package wiring substrate comprising:
   a plurality of circuit traces located entirely within the area array IC package wiring substrate;
   a plurality of vias, each connected to one of said at least one or more leads at said surface and to one of said plurality of circuit traces; and
   at least one of the circuit traces connected between two vias whereby two or more of said two or more stacked components are electrically connected to each other.

* * * * *